US006580513B2

United States Patent
Akahoshi (10) Patent No.: US 6,580,513 B2
(45) Date of Patent: Jun. 17, 2003

(54) OPTICAL WAVELENGTH MONITORING SYSTEM AND STABILIZING SYSTEM

(75) Inventor: Tetsuya Akahoshi, Kumamoto (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 90 days.

(21) Appl. No.: 09/963,744

(22) Filed: Sep. 27, 2001

(65) Prior Publication Data

US 2002/0093661 A1 Jul. 18, 2002

(30) Foreign Application Priority Data

Jan. 18, 2001 (JP) .................................. 2001-009933

(51) Int. Cl.[7] ................................................. G01B 9/02
(52) U.S. Cl. ...................................................... 356/484
(58) Field of Search ................................. 356/450, 484, 356/491; 359/577, 583; 372/32

(56) References Cited

U.S. PATENT DOCUMENTS 5,373,515 A * 12/1994 Wakabayashi et al. ........ 372/20
6,490,300 B1 * 12/2002 Nishioki et al. .............. 372/32

* cited by examiner

Primary Examiner—Samuel A. Turner
Assistant Examiner—Michael A. Lyons
(74) Attorney, Agent, or Firm—Venable LLP; Michael A. Sartori (57) ABSTRACT

The wavelength of light modulated according to a modulating signal is monitored by generating criterion light having a stable wavelength, combining part of the modulated light with the criterion light, comparing the combined light with the modulating signal, and calculating an error rate indicating how frequently the combined light disagrees with the modulating signal. A high error rate indicates that the modulated light has the same wavelength as the criterion light, leading to interference when the two are combined. In a monitoring system, an alarm signal is output if the error rate is too low. In a wavelength stabilizing system, the wavelength of the modulated light is controlled so as to maximize the error rate.

12 Claims, 7 Drawing Sheets

OPTICAL WAVELENGTH MONITORING SYSTEM AND STABILIZING SYSTEM

BACKGROUND OF THE INVENTION

The present invention relates to a system for stabilizing the output wavelength of a laser oscillator that generates light for transmission in an optical communication network, a system for monitoring the wavelength of a light signal received from an optical communication network, and more generally a method of monitoring the wavelength of a modulated light signal.

As optical communication networks carry increasing amounts of information, there is a trend toward the use of increasingly narrow optical wavelength bands, to avoid running out of wavelength resources. This trend has made it essential to study techniques for stabilizing the output wavelengths of optical signal transmitters.

In particular, growing communication traffic has led to the use of wavelength-division multiplexing systems with increasing numbers of wavelengths, therefore with increasingly narrow wavelength spacing. If the stability of the individual wavelengths deteriorates, crosstalk occurs between adjacent wavelengths, and communication quality is degraded. Communication systems in which wavelength-division multiplexing is employed therefore have stringent requirements for wavelength stability.

The transmitters used in optical communication systems, however, generally employ semiconductor lasers having a temperature-dependent wavelength characteristic; the emitted wavelength varies with the temperature of the laser. In conventional transmitters, this temperature-dependency problem is dealt with by measuring the temperature of the semiconductor laser, and using a heat-pumping device such as a Peltier device to hold the semiconductor laser at a substantially constant temperature. Conventional optical communication networks rely on this scheme to maintain wavelength stability, and do not attempt to monitor the wavelength of the received optical signals.

Figure 7:
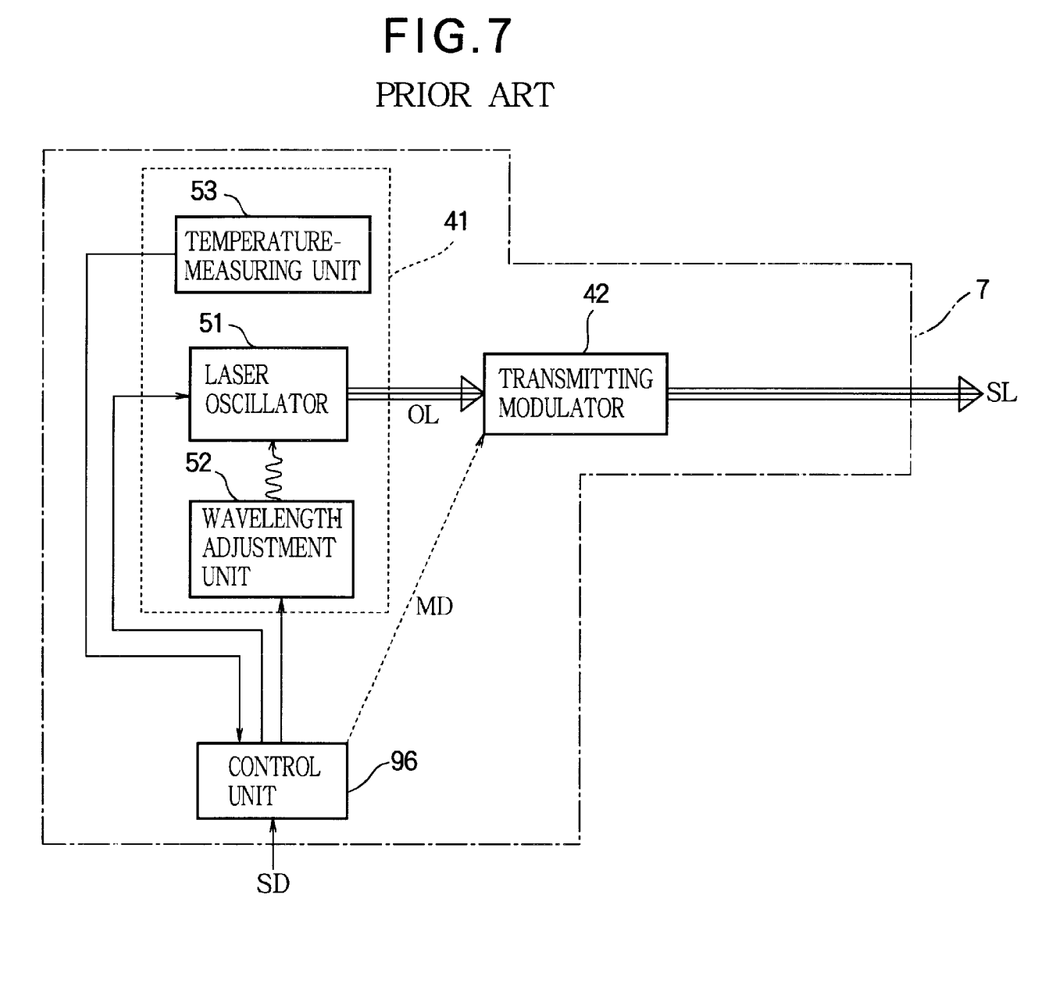
FIG. 7 is a block diagram of a conventional optical transmitting apparatus.

FIG. 7 shows a conventional optical transmitting apparatus that transmits a signal on, for example, an optical fiber in an optical communication network. The optical transmitting apparatus 7 includes a transmitting light source 41 that generates coherent output light OL with a fixed frequency, a transmitting modulator 42 that modulates the fixed-frequency output light OL to obtain a transmit light signal SL, and a control unit 96 that receives temperature information from the transmitting light source 41, supplies the transmitting light source 41 with control signals for adjusting the power and wavelength of the laser output light OL, receives information to be transmitted (send data, SD) from an external source (not visible), and sends a corresponding modulating signal MD to the transmitting modulator 42.

The transmitting light source 41 includes a laser oscillator 51 such as a semiconductor laser, a wavelength adjustment unit 52 including a heat-pumping device such as a Peltier device, and a temperature-measuring unit 53 including a device such as a thermistor that detects ambient temperature changes as changes in electrical resistance.

The conventional optical transmitting apparatus 7 operates as follows.

When information SD to be transmitted is input, the control unit 96 controls the transmitting light source 41 so that the laser oscillator 51 outputs light OL of a fixed wavelength, and supplies the transmitting modulator 42 with a modulating signal MD. The transmitting modulator 42 modulates the output light OL according to the modulating signal MD to obtain the transmit light signal SL.

If information SD to be transmitted is input continuously, the laser oscillator 51 operates continuously, and its temperature begins to rise. The temperature of the laser oscillator 51 may also rise because of heat generated from another device (not visible) in the equipment, or because of a rise in the ambient temperature. Similarly, a drop in the ambient temperature may lower the temperature of the laser oscillator 51. If the temperature of the laser oscillator 51 varies, so does the wavelength of the output light OL.

To limit these wavelength variations, the temperature-measuring unit 53 detects the temperature in the vicinity of the laser oscillator 51, and the control unit 96 responds by controlling the wavelength adjustment unit 52 so as to keep the temperature around the laser oscillator 51 within a fixed range. For example, the control unit 96 may operate according to two thresholds, controlling the wavelength adjustment unit 52 so as to lower the temperature around the laser oscillator 51 if the temperature indicated by the temperature-measuring unit 53 exceeds the upper threshold, and to raise the temperature around the laser oscillator 51 if the temperature indicated by the temperature-measuring unit 53 falls below the lower threshold. A feedback loop is thereby established, involving the wavelength adjustment unit 52, the temperature-measuring unit 53, and the control unit 96.

A problem with this feedback loop is that it is not always possible to mount the thermistor or other temperature-sensing element of the temperature-measuring unit 53 close enough to the laser oscillator 51 to detect its temperature accurately. There may be a considerable difference between the temperature measured by the temperature-measuring unit 53 and the actual temperature of the laser oscillator 51, preventing the control unit 96 from keeping the temperature of the laser oscillator 51 within the desired range. Since the feedback loop does not include any measurement of the wavelength of the output light OL or light signal SL, there is no guarantee that feedback control will actually produce the desired wavelength.

SUMMARY OF THE INVENTION

An object of the present invention is to provide a method of monitoring the wavelength of a modulated light signal.

Another object of the invention is to stabilize the wavelength of light generated by a laser oscillator and modulated for transmission in an optical communication system.

Another object is to monitor the wavelength of a modulated light signal received in an optical communication system.

The invented method of monitoring the wavelength of a modulated light signal includes the steps of generating criterion light having a stable wavelength, splitting the modulated light signal into at least two parts, and combining one part of the modulated light signal with the criterion light, thereby obtaining a combined light signal. The combined light signal is compared with the modulating signal, and an error rate indicating how often the combined light signal disagrees with the modulating signal is calculated. A high error rate indicates wavelength agreement between the modulated light signal and the criterion signal, since wavelength agreement leads to interference when the modulated light signal and criterion light are combined.

The comparison step may include conversion of the combined light signal to an electrical signal.

The criterion light may also be modulated according to the modulating signal, to make the error rate a more sensitive indicator of wavelength agreement.

The polarization planes of the modulated light signal and the criterion light are preferably controlled so that the modulated light signal and criterion light are polarized in the same plane when combined, leading to greater interference when their wavelengths match.

In an optical transmitting apparatus, the invented method can be used to control the wavelength of light output by a laser oscillator. For example, the wavelength can be controlled by controlling the temperature of the laser oscillator according to the error rate. In this case, the modulating signal is a signal by which the output light of the laser oscillator is modulated.

The invention may also be used to monitor the wavelength of a modulated light signal received by an optical receiving apparatus. In this case, the modulating signal is determined from the output of the optical receiving apparatus.

When the optical transmitting apparatus or the optical receiving apparatus is located at a node in an optical communication network, the reference light source may be external to the node, and may supply the criterion light to a plurality of nodes in the network.

DETAILED DESCRIPTION OF THE INVENTION

Embodiments of the invention will be described with reference to the attached drawings, in which like parts are indicated by like reference characters. Repeated descriptions of conventional elements also appearing in FIG. 7 will be omitted.

Figure 1:
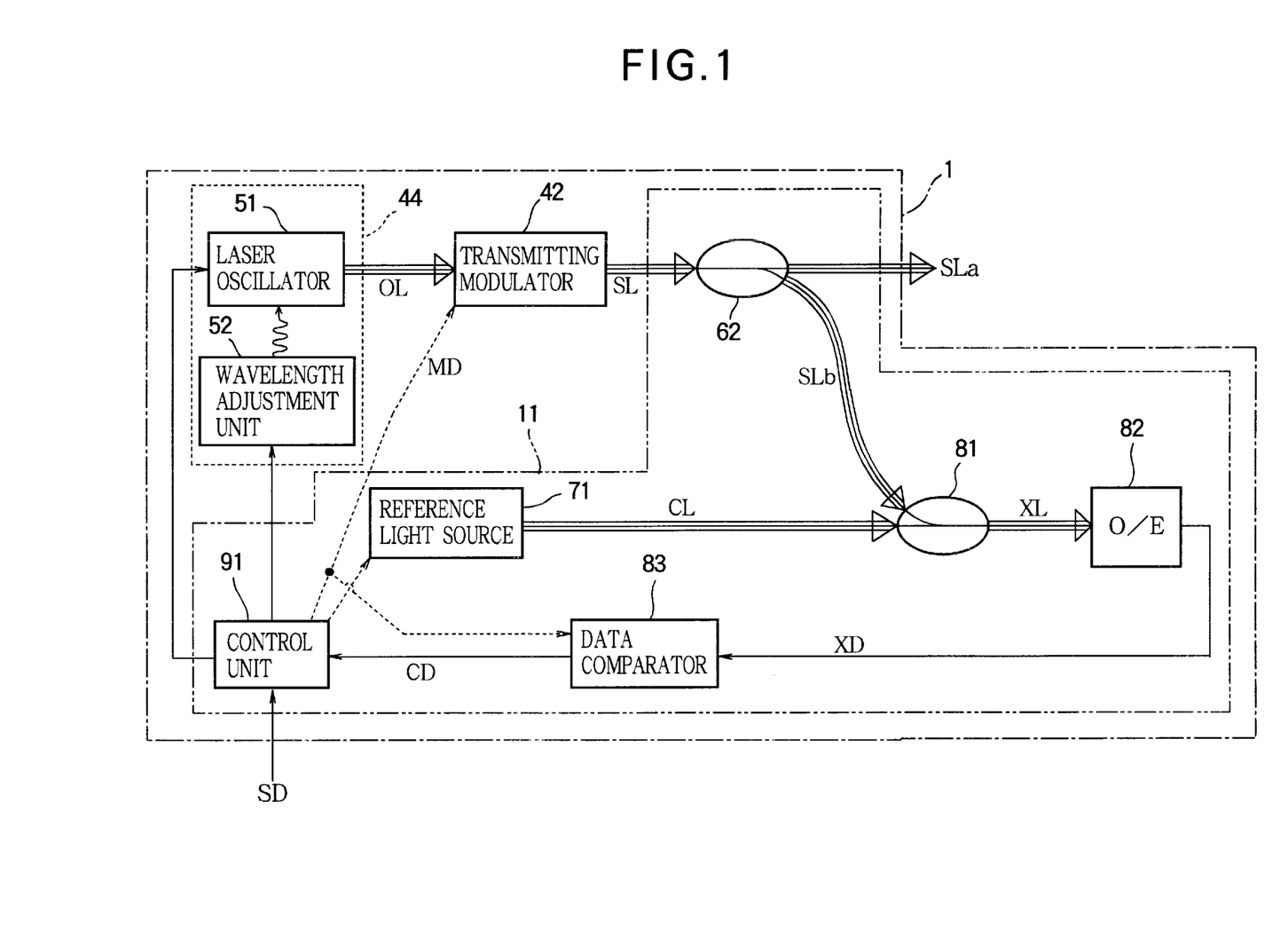
FIG. 1 is a block diagram of an optical transmitting apparatus illustrating a first embodiment of the invention.

The optical transmitting apparatus 1 in FIG. 1 includes a wavelength stabilization system 11 embodying the present invention. The optical transmitting apparatus 1 also includes a conventional transmitting modulator 42, and a transmitting light source 44 comprising a conventional laser oscillator 51 and a conventional wavelength adjustment unit 52. The transmitting light source 44 does not include a temperature-measuring unit.

The wavelength stabilization system 11 includes an optical splitter 62, a reference light source 71, an optical combiner 81, an optical-electrical (O/E) converter 82, a data comparator 83, and a control unit 91.

The control unit 91 receives information SD to be transmitted and generates a corresponding modulating signal MD, which is supplied to both the transmitting modulator 42 and the data comparator 83. The information SD is received from, for example, a telephone set or facsimile machine (not visible). The control unit 91 also receives comparison result data CD from the data comparator 83, and generates signals that control the laser oscillator 51 and wavelength adjustment unit 52. To control the wavelength adjustment unit 52, the control unit 91 calculates an error rate from the comparison result data CD, and varies the control signal sent to the wavelength adjustment unit 52 until a maximum error rate is obtained.

The optical splitter 62 uses an optical element such as a semitransparent mirror or prism to split the transmit light signal SL received from the transmitting modulator 42 into two parts SLa, SLb. Light signal SLa forms the output of the optical transmitting apparatus 1. Light signal SLb is sent to the optical combiner 81.

The reference light source 71 is a light-emitting device such as a semiconductor laser or light-emitting diode that operates with relatively little temperature dependence and emits criterion light CL with a highly stable wavelength.

The optical combiner 81 combines the criterion light signal CL from the reference light source 71 with the split-off light signal SLb from the optical splitter 62 to generate a combined light signal XL.

The optical-electrical converter 82 converts the combined light signal XL to an electrical signal XD, which is supplied to the data comparator 83.

The data comparator 83 compares the electrical signal XD with the modulating signal MD, and supplies the comparison result data CD to the control unit 91.

Furthermore, when the combined light signal XL is compared with the modulating signal MD, an output power of the criterion light signal CL has been adjusted in order to prevent deviation of synchronization.

The elements described above form a type of feedback loop. A difference between this feedback loop and most conventional feedback loops is that the control unit 91 attempts to maximize the error, instead of minimizing the error. Further explanation will be given in the following description of the operation of the optical transmitting apparatus 1.

When the control unit 91 receives information SD to be transmitted, it sends control signals to the laser oscillator 51 and reference light source 71, causing them to generate output light OL and criterion light CL at nominally equal wavelengths. The control unit 91 also converts the information SD to a modulating signal MD. The transmitting modulator 42 modulates the output light OL according to the modulating signal MD. The optical splitter 62 splits the resulting light signal SL into two parts SLa and SLb, of which SLa is transmitted to the outside and SLb is supplied to the optical combiner 81. Light signal SL and its two parts SLa, SLb have the same wavelength as the output light OL.

When the split-off light signal SLb is combined with the criterion light CL in the optical combiner 81, if the split-off light signal SLb and the criterion light CL have the same wavelength, they will interfere strongly, and the information carried in the light signal will be difficult to detect in the combined light signal XL or the electrical signal XD. Thus, when the data comparator 83 compares the electrical signal XD with the modulating signal MD, it will find comparatively little correlation between the two, and the control unit 91 will calculate a high error rate from the comparison result data CD.

If the light signal SLb and criterion light CL have slightly different wavelengths, they will interfere less. The information carried in the light signal SLb will then be more easily detectable in the combined light signal XL, the data comparator 83 will detect a stronger correlation between the electrical signal XD and the modulating signal MD, and the control unit 91 will calculate a lower error rate. In general, the more difference there is between the wavelengths of the light signal SLb and the criterion light CL, the less they will interfere and the lower the error rate will be.

The error rate accordingly provides feedback information that the control unit 91 uses to determine how to control the wavelength adjustment unit 52 in order to reach the maximum error rate. At this error rate, the split-off light SLb, and thus the output light OL, the light signal SL, and the transmit light signal SLa, have substantially the same wavelength as the criterion light CL. Since the criterion light CL has high wavelength stability, not varying with temperature, the transmit light signal SLa has similar wavelength stability.

Compared with the conventional optical transmitting apparatus 7 shown in FIG. 7, the optical transmitting apparatus 1 in FIG. 1 can achieve a higher degree of wavelength stability, because the wavelength of the modulated light signal is compared directly with the wavelength of the highly stable reference light source 71, by measuring the error rate produced by interference between the two light signals. A further advantage is that no temperature measurement is necessary. The first embodiment is therefore particularly useful in situations in which it would be impractical to mount a thermistor or other temperature-sensing device close to the laser oscillator 51.

Figure 2:
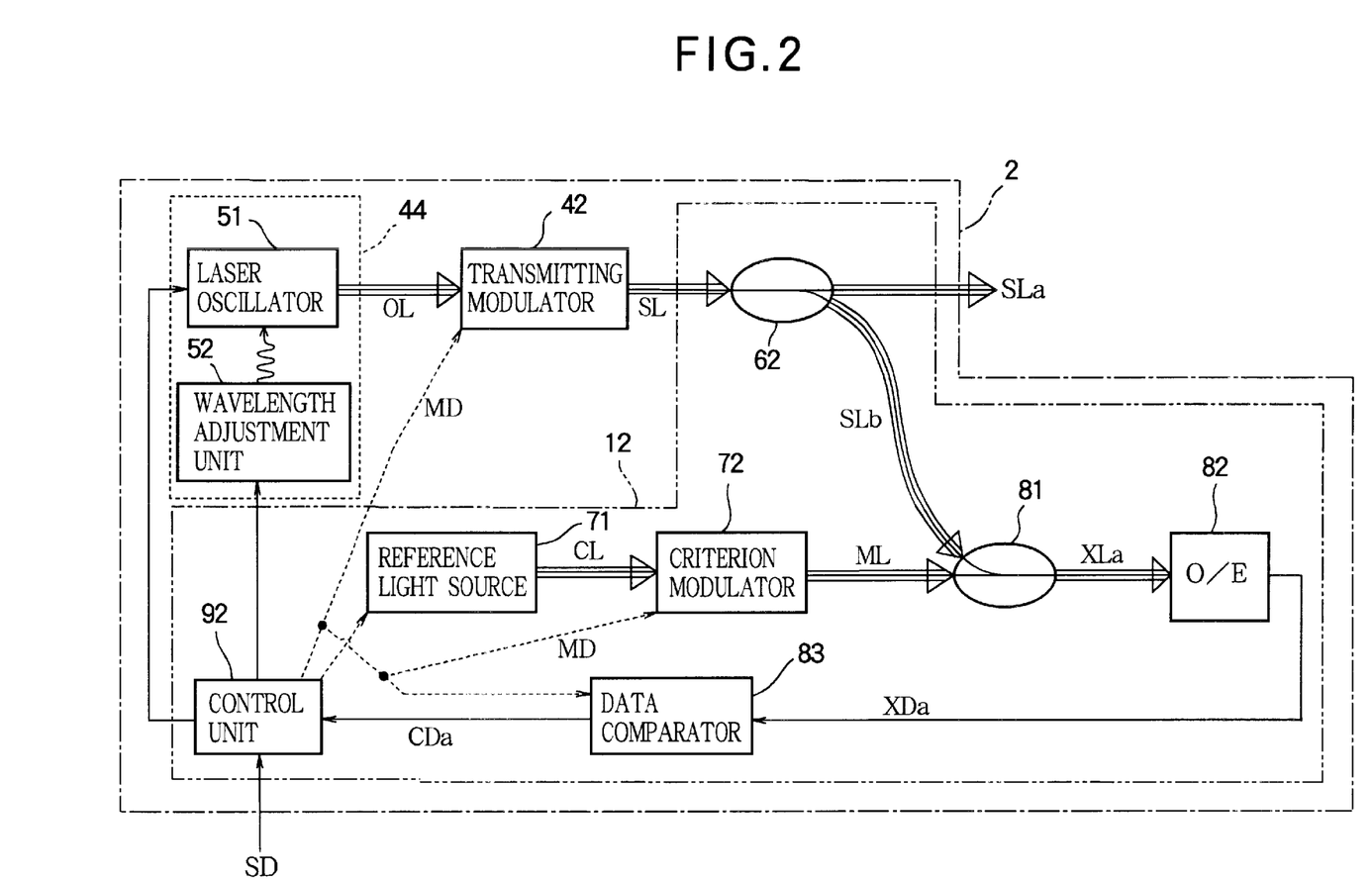
FIG. 2 is a block diagram of an optical transmitting apparatus illustrating a second embodiment of the invention.

FIG. 2 illustrates a second embodiment of the invention, which adds a criterion modulator 72 to the structure of the first embodiment, and modifies the control unit 92. The other elements in the wavelength stabilization system 12 in the optical transmitting apparatus 2 in FIG. 2 are similar to the corresponding elements in FIG. 1.

The principal modification to the control unit 92 is that it supplies the modulating signal MD not only to the transmitting modulator 42 and data comparator 83, but also to the criterion modulator 72.

The criterion modulator 72 modulates the criterion light CL according to the modulating signal MD, and supplies the modulated criterion light ML to the optical combiner 81 to be combined with light signal SLb. The modulated criterion light ML has the same wavelength as the criterion light CL.

The combined light signal XLa is converted to an electrical signal XDa by the optical-electrical converter 82 and compared with the modulating signal MD by the data comparator 83. Since both components SLb and ML of the combined signal XLa have been modulated according to the same modulating signal MD, when the two components SLb, ML differ in wavelength and interference is relatively slight, the electrical signal XDa will closely match the modulating signal MD, and the control unit 92 will measure a lower error rate than in the first embodiment from the comparison result data CDa. When the two components SLb, ML have the same wavelength or nearly the same wavelength, however, they will still interfere strongly and a high error rate will be measured, as in the first embodiment.

Compared with the first embodiment, accordingly, the second embodiment produces a sharper decline in the error rate as the wavelength of the light signal SLb moves away from the wavelength of the criterion light CL. This enables the control unit 92 to adjust the wavelength of the laser oscillator 51 more closely to the wavelength of the reference light source 71 than in the first embodiment.

Depending on the modulation system used, modulation of the criterion light may also have the effect of increasing the amount of interference when the wavelength of the laser oscillator 51 matches the wavelength of the reference light source 71. Once again, the result is a steeper decline in the error rate as the wavelength of the laser oscillator 51 moves away from the wavelength of the reference light source 71.

Figure 3:
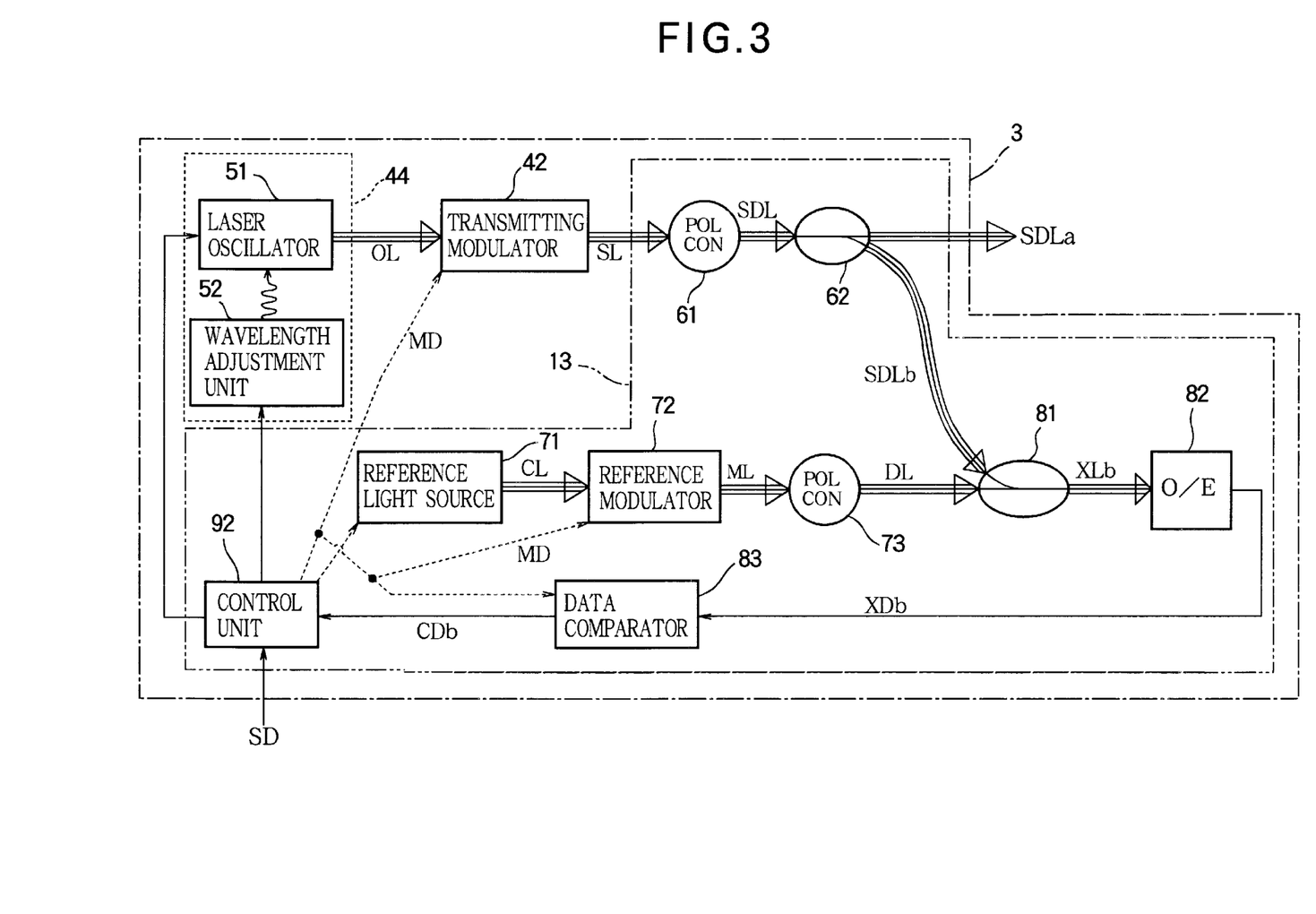
FIG. 3 is a block diagram of an optical transmitting apparatus illustrating a third embodiment of the invention.

FIG. 3 illustrates a third embodiment of the invention, which adds a pair of polarization controllers (POL CON) 61, 73 to the structure of the second embodiment, and modifies the control unit 92. The other elements in the wavelength stabilization system 13 in the optical transmitting apparatus 3 in FIG. 3 are similar to the corresponding elements in FIG. 2.

The polarization controllers 61, 73 are, for example, optical polarizers or polarizing prisms. The first polarization controller 61 is inserted between the transmitting modulator 42 and optical splitter 62 to control the polarization plane of the light signal SL. The polarization-controlled light signal output from the polarization controller 61 to the optical splitter 62 is denoted SDL. The second polarization controller 73 is inserted between the criterion modulator 72 and optical combiner 81 to control the polarization plane of the modulated criterion light ML. The polarization-controlled light output from the polarization controller 73 to the optical combiner 81 is denoted DL.

Aside from controlling the polarization planes of the light signal and criterion light, the optical transmitting apparatus 3 operates as described in the second embodiment. The split-off polarization-controlled light signal SDLb is combined with the polarization-controlled modulated criterion light DL. The polarization controllers 61, 73 are arranged so that the split-off polarization-controlled light signal SDLb and the polarization-controlled modulated criterion light DL are both polarized in the same plane. The combined light XLb is converted to an electrical signal XDb, and the control unit 94 controls the wavelength adjustment unit 52 so as to maximize the error rate calculated from the comparison result data CDb.

In general, the degree of interference between two light waves depends on the angle between their polarization planes. If the two polarization planes are mutually orthogonal, for example, no interference occurs. Maximum interference occurs when the two polarization planes are identical.

Because of the matched polarization of the two components SDLb, DL of the combined light signal XLb, accordingly, when the wavelength of the laser oscillator 51 matches the wavelength of the reference light source 71, the split-off polarization-controlled light signal SDLb and modulated polarization-controlled criterion light DL tend to interfere more strongly than in the preceding embodiments, and the control unit 93 measures a higher error rate. Thus as the wavelength of the laser oscillator 51 moves away from the wavelength of the reference light source 71, there is an even sharper decline in the error rate than in the second embodiment. This enables the control unit 93 to adjust the wavelength of the laser oscillator 51 more closely to the wavelength of the reference light source 71 than in the second embodiment, so that the transmit light signal SDLa has even higher wavelength stability than in the second embodiment.

Figure 4:
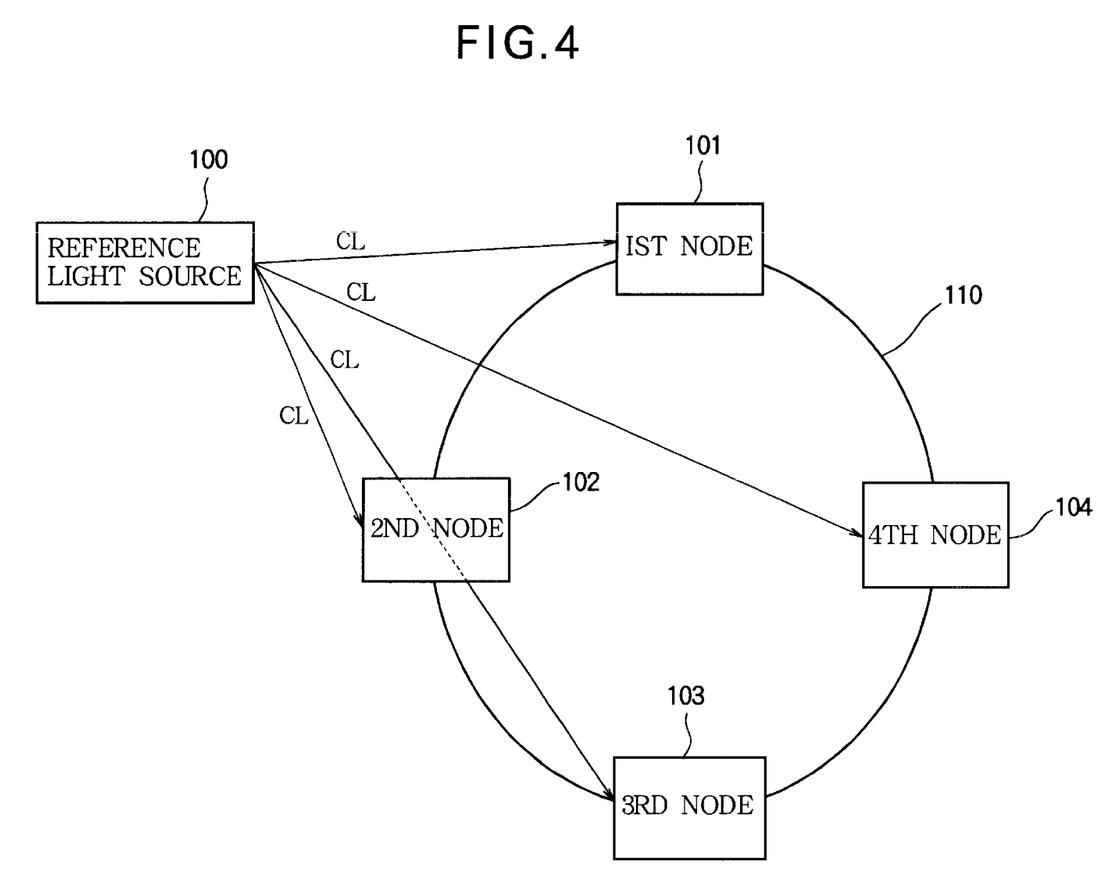
FIG. 4 is a block diagram of an optical ring network in which the invention is applied.
Figure 5:
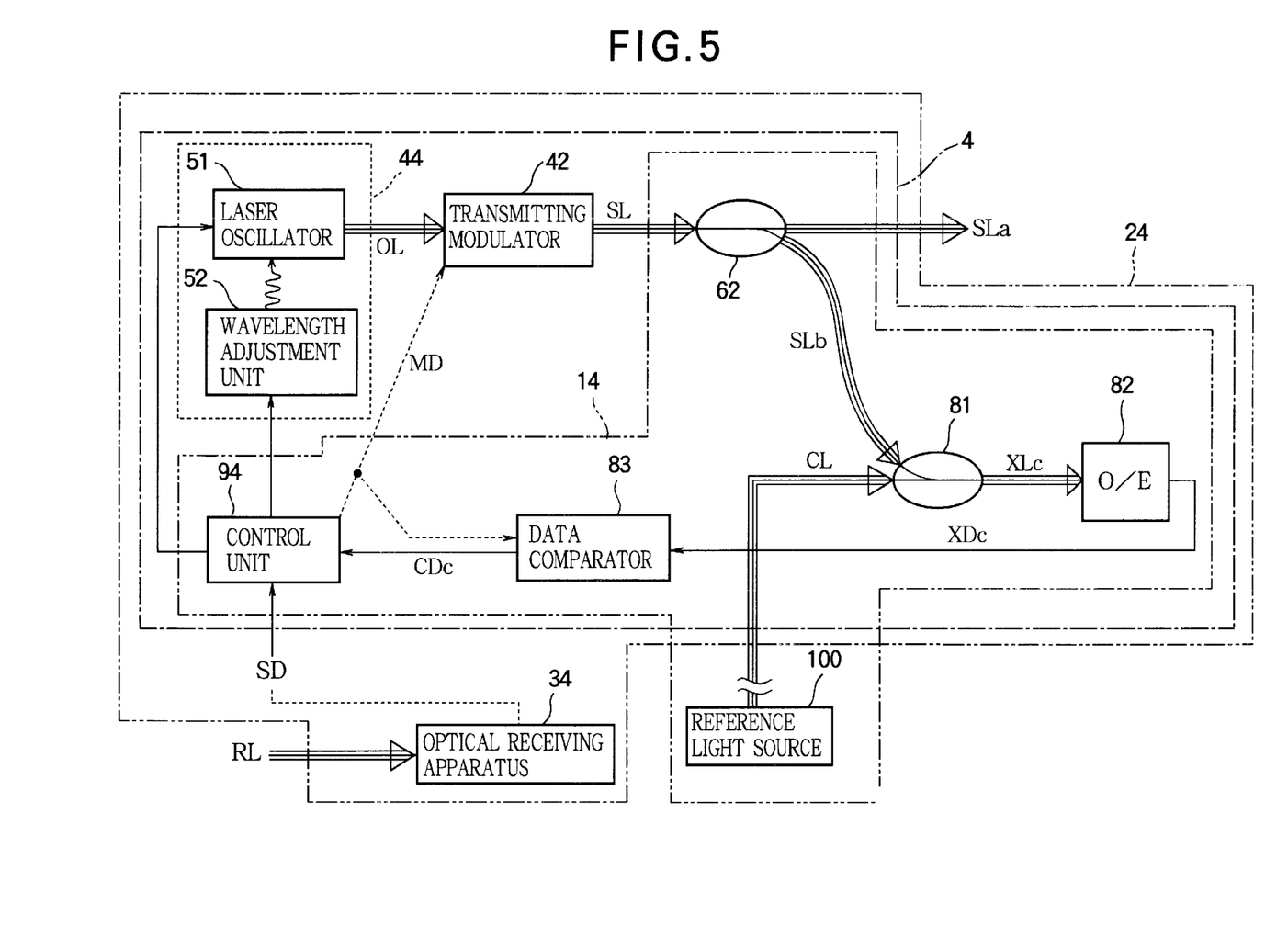
FIG. 5 is a block diagram of a node in the network in FIG. 4, illustrating a fourth embodiment of the invention.

FIG. 4 shows a reference light source 100, which constitutes part of a fourth embodiment of the invention, transmitting criterion light CL to four nodes 101, 102, 103, 104 linked by an optical ring network 110. FIG. 5 shows how the reference light source 100 is connected to an arbitrary node 24, which may be any one of the four nodes 101, 102, 103, 104 in FIG. 1. The reference light source 100 supplies the same criterion light CL to all of these nodes.

The node 24 in FIG. 5 includes an optical receiving apparatus 34, which receives a light signal RL from the optical ring network 110, and an optical transmitting apparatus 4, which transmits a light signal SLa to the optical ring network 110.

The optical transmitting apparatus 4 is generally similar to the optical transmitting apparatus in the first embodiment, except that criterion light CL is supplied to the optical combiner 81 by the reference light source 100, which is external to the node 24, and the control unit 94 does not control the reference light source 100.

Aside from obtaining criterion light CL from the external reference light source 100, the optical transmitting apparatus 4 operates as described in the first embodiment. The criterion light CL is combined with light signal SLb, the combined light XLc is converted to an electrical signal XDc, and the control unit 94 controls the wavelength adjustment unit 52 so as to maximize the error rate calculated from the comparison result data CDc.

The information SD to be transmitted may be obtained from terminal equipment such as a facsimile machine or telephone (not visible) connected to the node 24, as mentioned in the first embodiment. However, the control unit 94 may also receive this information SD from the optical receiving apparatus 34, as shown. The optical receiving apparatus 34 generates the information SD by converting the received light RL to an electrical signal. The optical receiving apparatus 34 may also amplify or reshape the electrical signal to optimize the waveform of the information signal SD.

When several nodes are linked in a network of the type shown in FIG. 4, it is necessary to stabilize the wavelengths of the optical transmitting apparatus at all of the nodes in the same way. By supplying criterion light from a common reference light source 100, the fourth embodiment assures that all nodes are stabilized at the same wavelength.

The fourth embodiment can be modified by using the optical transmitting apparatus of the second or third embodiment instead of the optical transmitting apparatus of the first embodiment as a basis for the optical transmitting apparatus 4.

Figure 6:
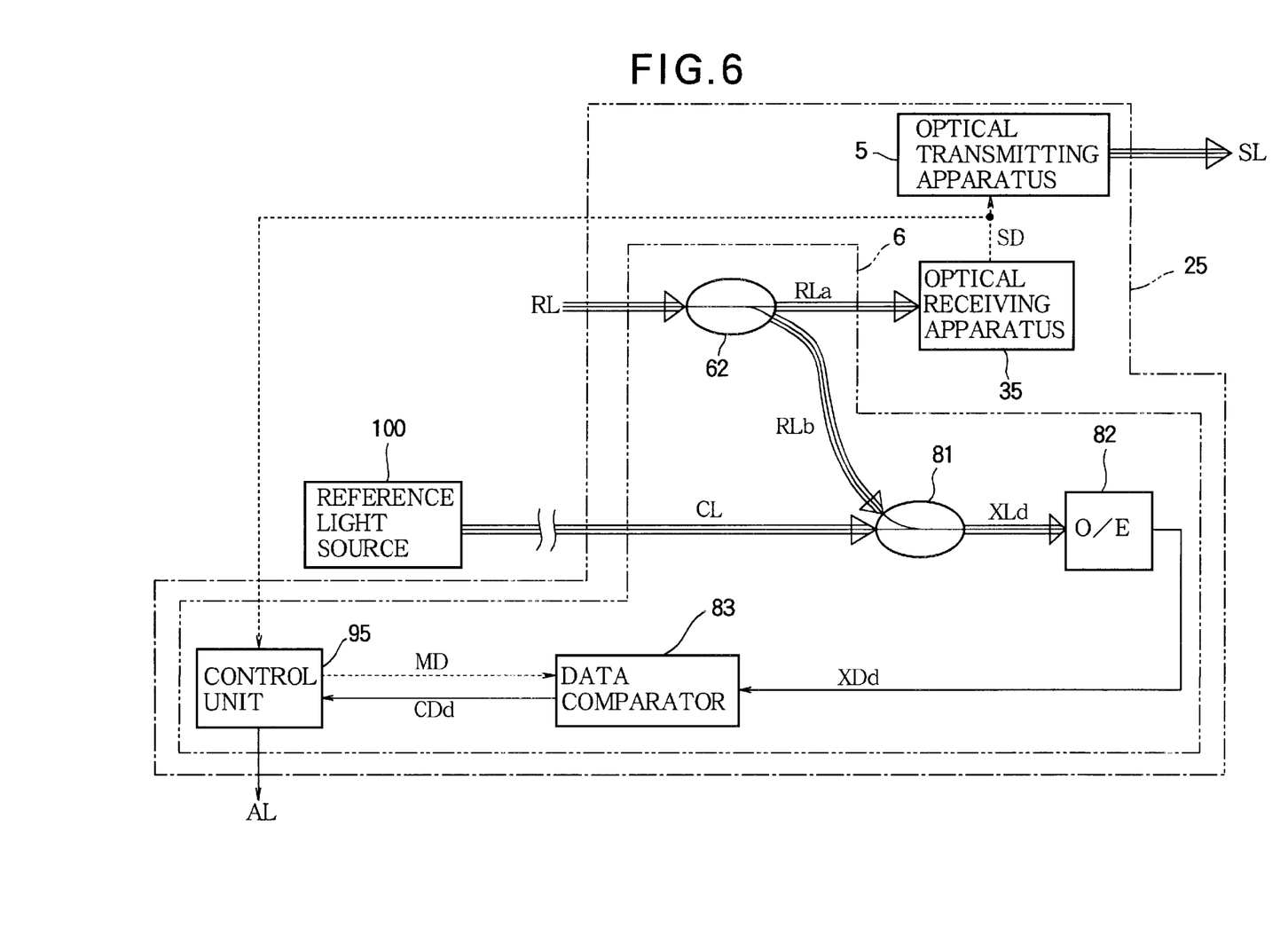
FIG. 6 is another block diagram of a node in the network in FIG. 4, illustrating a fifth embodiment of the invention.

Illustrating a fifth embodiment of the invention, FIG. 6 shows another node 25 in an optical ring network. The node 25 may be any one of the four nodes 101, 102, 103, 104 in FIG. 4, for example.

The node 25 in FIG. 6 includes an optical transmitting apparatus 5 similar to, for example, the optical transmitting apparatus 4 in FIG. 5, an optical receiving apparatus 35 similar to the optical receiving apparatus 34 in FIG. 5, and a wavelength monitoring apparatus 6. The wavelength monitoring apparatus 6 receives criterion light CL from a reference light source 100, which may be external to the node 25, as shown in FIG. 4. The wavelength monitoring apparatus 6 uses the criterion light CL and the method of the preceding embodiments to monitor the wavelength of the received light RL before the received light is supplied to the optical receiving apparatus 35.

The wavelength monitoring apparatus 6 comprises an optical splitter 62, an optical combiner 81, an optical-electrical converter 82, a data comparator 83, and a control unit 95. The optical splitter 62 splits the received light RL into two parts RLa and RLb, supplies RLa to the optical receiving apparatus 35, and supplies RLb to the optical combiner 81. The optical combiner 81 combines RLb with the criterion light from the reference light source 100. The optical-electrical converter 82 converts the combined light XLd to an electrical signal XDd.

The received light RL and its parts RLa, RLb are modulated signals similar to the light signals SL, SLa, SLb in the preceding embodiments. The optical receiving apparatus 35 converts the received light RLa to information SD to be transmitted, which is supplied to the optical transmitting apparatus 5 and the control unit 95. The control unit 95 uses this information SD to generate a modulating signal MD which may be, for example, substantially identical to SD. The modulating signal MD represents the information carried in the received light RL. The control unit 95 sends the modulating signal MD to the data comparator 83, where it is compared with the electrical signal XDd, and determines an error rate from the comparison results CDd.

As explained in the preceding embodiments, if the wavelength of the received light RL substantially matches the wavelength of the criterion light CL, the light signals RLb and CL combined in the optical combiner 81 interfere strongly, so the electrical signal XDd will frequently disagree with the modulating signal MD and a high error rate will be measured. If the wavelength of the received light RL moves away from the wavelength of the criterion light CL, the error rate decreases. If the error rate falls below a predetermined alarm threshold value, the control unit 95 sends an alarm signal AL to system supervisory equipment (not visible) to notify an administrator of the network in FIG. 4, for example, that the wavelength of the received light RL is varying excessively. The system administrator can then take corrective action, such as repairing or replacing the optical transmitting apparatus that transmitted the received light RL.

Although this is not shown in FIG. 6, the reference light source 100 may also supply criterion light CL to the optical transmitting apparatus 5.

The fifth embodiment enables the received light signals at all network nodes to be monitored with reference to the same criterion light CL.

The fifth embodiment can be modified by modulating the criterion light CL as in the second embodiment, and by adding polarization controllers as in the third embodiment, to achieve more accurate wavelength monitoring. In an optical ring network in which the same light signal circulates around all nodes, the criterion modulator and polarization controller that modulate and control the polarization of the criterion light CL can be installed together with the reference light source 100 at a central location, instead of at each node, thereby reducing the cost of the system.

In the foregoing embodiments, the invention has been used to stabilize the wavelength of a transmitted light signal, and to monitor the wavelength of a light signal received at a node in an optical communication network, but the invention can also be used to monitor the wavelength of the optical signal at an arbitrary point in the network.

Those skilled in the art will recognize that further variations are possible within the scope claimed below.

What is claimed is:

1. A method of monitoring the wavelength of a light signal modulated according to a modulating signal, comprising the steps of:

(a) generating criterion light having a stable wavelength;

(b) splitting the modulated light signal into at least two parts;

(c) combining one part of the modulated light signal with the criterion light, thereby obtaining a combined light signal;

(d) comparing the combined light signal with the modulating signal; and (e) calculating an error rate indicating how often the combined light signal disagrees with the modulating signal, whereby wavelength agreement between the modulated light signal and the criterion light is detected as a high error rate due to interference in said step (c).

2. The method of claim 1, wherein said step (d) includes converting the combined light signal to an electrical signal.

3. The method of claim 1, further comprising the step of modulating the criterion light signal according to the modulating signal, before said step (c).

4. The method of claim 1, further comprising the steps of:

controlling a polarization plane of the modulated light signal; and controlling a polarization plane of the criterion light signal so that the modulated light signal and the criterion light signal have identical polarization planes when combined in said step (c).

5. A system for stabilizing the wavelength of light output by a laser oscillator in an optical transmitting apparatus for transmission on an optical communication channel, said light being modulated according to a modulating signal, comprising:

an optical splitter for dividing the modulated light into a first part and a second part, the first part being supplied to the optical communication channel;

a reference light source generating criterion light having a substantially constant wavelength, even when the criterion light is generated continuously;

an optical combiner for optically combining the second part of the modulated light with the criterion light to obtain combined light;

an optical-electrical converter for converting the combined light to an electrical signal;

a data comparator for comparing said electrical signal with said modulating signal, thereby generating comparison result data; and a control unit for calculating an error rate from the comparison result data, the error rate indicating how often said electrical signal disagrees with said modulating signal, and for controlling the wavelength of the light output by the laser oscillator so as to maximize said error rate.

6. The system of claim 5, further comprising a criterion modulator inserted between the reference light source and the optical combiner, for modulating the criterion light according to the modulating signal.

7. The system of claim 6, further comprising:

a first polarization controller for controlling the modulated light so that the second part of the modulated light received by the optical combiner has a predetermined polarization plane; and a second polarization controller for controlling the modulated criterion light so that the modulated criterion light received by the optical combiner also has said predetermined polarization plane.

8. The system of claim 5, further comprising means for aligning polarization planes of the modulated light and the criterion light, so that when combined by the optical combiner, the second part of the modulated light and the criterion light are both polarized in a single plane.

9. The system of claim 5, wherein the reference light source supplies the criterion light to a plurality of nodes in an optical communication network, and the laser oscillator, the optical splitter, the optical combiner, the optical-electrical converter, the data comparator, and the control unit are disposed at one of said nodes.

10. The system of claim 5, wherein the control unit controls the wavelength of the light output by the laser oscillator by heating and cooling the laser oscillator.

11. A system for monitoring the wavelength of modulated light received by an optical receiving apparatus at a node in an optical communication system, comprising:

an optical splitter for dividing the modulated light into a first part and a second part, the first part being supplied to the optical receiving apparatus;

a reference light source generating criterion light having a substantially constant wavelength, even when the criterion light is generated continuously;

an optical combiner for optically combining the second part of the modulated light with the criterion light to obtain combined light;

an optical-electrical converter for converting the combined light to an electrical signal;

a data comparator for comparing said electrical signal with a modulating signal, and generating comparison result data; and a control unit receiving an information signal from the optical receiving apparatus, generating the modulating signal on the basis of said information signal, calculating an error rate from the comparison result data, the error rate indicating how often said electrical signal disagrees with the modulating signal, and generating an alarm signal when the error rate falls below a predetermined value, the alarm signal indicating excessive variation in the wavelength of the modulated light signal.

12. The system of claim 11, wherein the reference light source supplies the criterion light to a plurality of nodes in an optical communication network, said node being one of said nodes, and the optical splitter, the optical combiner, the optical-electrical converter, the data comparator, and the control unit are disposed at said node.

* * * * *